(12) United States Patent
Brun et al.

(10) Patent No.: US 8,814,054 B2
(45) Date of Patent: Aug. 26, 2014

(54) INCLUSION OF CHIP ELEMENTS IN A SHEATHED WIRE

(75) Inventors: Jean Brun, Champagnier (FR); Laurent Lancon, Saint-Etienne-de-Fontbellon (FR); Dominique Vicard, Bernin (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 0 days.

(21) Appl. No.: 13/703,255

(22) PCT Filed: Jun. 23, 2011

(86) PCT No.: PCT/FR2011/000359
§ 371 (c)(1),
(2), (4) Date: Dec. 10, 2012

(87) PCT Pub. No.: WO2011/161336
PCT Pub. Date: Dec. 29, 2011

(65) Prior Publication Data
US 2013/0092742 A1  Apr. 18, 2013

(30) Foreign Application Priority Data
Jun. 24, 2010  (FR) ..................... 10 02656

(51) Int. Cl.
  G06K 19/06   (2006.01)
  D02G 3/36    (2006.01)
  G06K 19/077  (2006.01)
  H01L 25/00   (2006.01)
  H01L 23/00   (2006.01)

(52) U.S. Cl.
  CPC .......... *G06K 19/07749* (2013.01); *D02G 3/362* (2013.01); *H01L 2224/858* (2013.01); *H01L 26/0655* (2013.01); *H01L 2924/01058* (2013.01); *G06K 19/07758* (2013.01); *H01L 2224/8517* (2013.01); *G06K 19/07786* (2013.01); *G06K 19/07718* (2013.01); *H01L 2924/00014* (2013.01); *H01L 25/50* (2013.01); *H01L 24/78* (2013.01); *D10B 2401/18* (2013.01); *H01L 2224/78* (2013.01); *H01L 24/85* (2013.01); *H01L 2924/01014* (2013.01)
  USPC ........................................... 235/492; 235/493

(58) Field of Classification Search
  USPC .................................. 235/492, 493; 29/592.1
  See application file for complete search history.

(56) References Cited

U.S. PATENT DOCUMENTS

| | | | |
|---|---|---|---|
| 3,644,866 A | 2/1972 | Deardurff | |
| 4,232,507 A | 11/1980 | Northup et al. | |
| 4,262,480 A | 4/1981 | Wasserman et al. | |
| 4,899,529 A | 2/1990 | Fumio | |
| 8,012,795 B2 | 9/2011 | Brun et al. | |
| 8,258,011 B2 | 9/2012 | Brun et al. | |
| 2009/0227069 A1* | 9/2009 | Brun et al. | 438/113 |
| 2009/0245733 A1* | 10/2009 | Berger | 385/77 |

(Continued)

FOREIGN PATENT DOCUMENTS

| | | |
|---|---|---|
| EP | 2 099 060 A1 | 9/2009 |
| WO | WO 98/33155 A1 | 7/1998 |

(Continued)

OTHER PUBLICATIONS

International Search Report issued in International Application No. PCT/FR2011/000359 dated Sep. 8, 2011.

(Continued)

*Primary Examiner* — Sonji Johnson
(74) *Attorney, Agent, or Firm* — Oliff PLC

(57) ABSTRACT

A method for forming a sheathed wire includes the steps of: axially advancing a core through a sheathing zone; wrapping a sheathing fiber around the core in the sheathing zone; and providing, in the sheathing zone, a series of microelectronic chip elements each provided with a wire section, in such a way that the sheathing fiber that wraps around the core also wraps around a chip element and the wire section thereof to form a sheathed wire incorporating spaced-apart chip elements.

9 Claims, 2 Drawing Sheets

(56) References Cited

U.S. PATENT DOCUMENTS

| | | |
|---|---|---|
| 2010/0136746 A1 | 6/2010 | Brun et al. |
| 2010/0245182 A1 | 9/2010 | Vicard et al. |
| 2011/0001237 A1 | 1/2011 | Brun et al. |

FOREIGN PATENT DOCUMENTS

| | | |
|---|---|---|
| WO | WO 2004/073130 A1 | 8/2004 |
| WO | WO 2008/080245 A2 | 7/2008 |
| WO | WO 2008080245 A2 * | 7/2008 |
| WO | WO 2009/004243 A2 | 1/2009 |

OTHER PUBLICATIONS

International Preliminary Report on Patentability issued in International Application No. PCT/FR2011/000359 dated Dec. 28, 2012 (with translation).

* cited by examiner

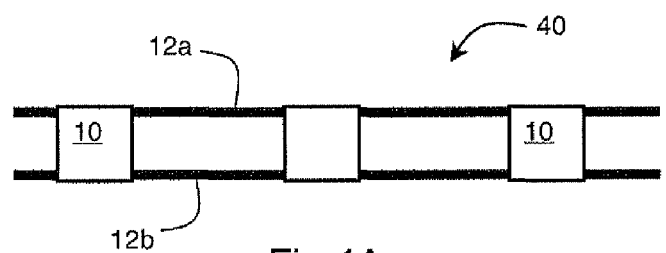
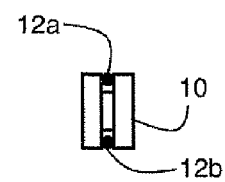
Fig 4A    Fig 4B
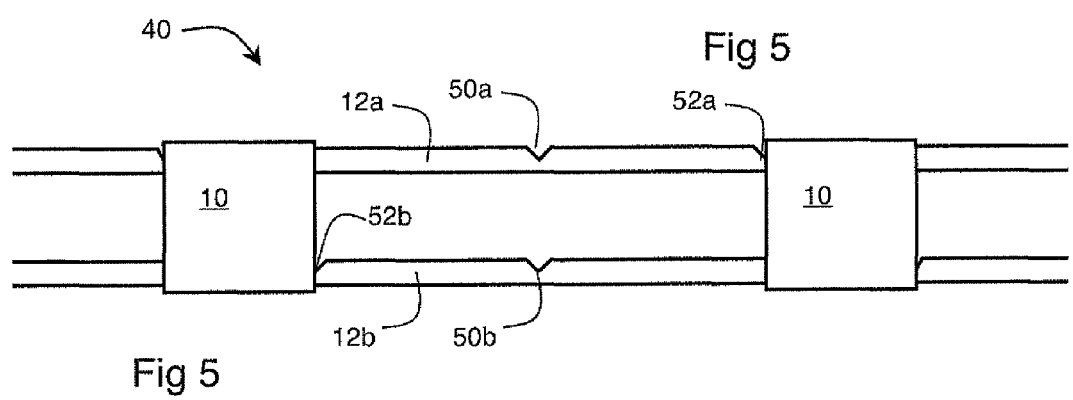
Fig 5
Fig 5
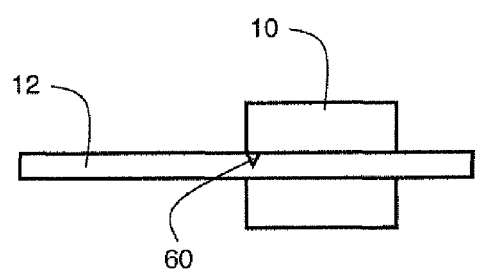
Fig 6

INCLUSION OF CHIP ELEMENTS IN A SHEATHED WIRE

BACKGROUND OF THE INVENTION

The invention relates to microelectronic chip elements having a largest dimension that may be smaller than one millimeter. The invention more specifically relates to a method for packaging such chip elements to ease their storage and their manipulation.

STATE OF THE ART

FIG. 1 schematically shows a miniaturized radio frequency transceiver device, for example used for contactless identification (RFID-type device). The device comprises a chip element 10, of generally parallelepipedal shape, incorporating a chip which integrates all RFID functions.

The device comprises a dipole antenna formed of two conductor wire sections 12a and 12b. These sections, connected to two opposite surfaces of element 10, are connected to terminals of the chip and extend in opposite directions.

Since the large side of chip element 10 may be shorter than 1 mm, these devices are not manufactured and manipulated by methods used for larger devices.

Patent application WO2009004243 describes an example of a method for forming RFID devices of the type in FIG. 1. Once formed, such devices are to be incorporated in the objects to be identified, This poses handling problems, since the antennas should remain substantially rectilinear, or should at least not be shorted by twisting.

OBJECT OF THE INVENTION

Thus, a solution for easing the handling of individualized chip elements of very small size is needed, especially when said elements are provided with wire sections which are desired to be kept substantially rectilinear.

To tend to fulfill this need, a method for forming a sheathed wire is provided, comprising the steps of: axially advancing a core through a sheathing zone; wrapping a sheathing fiber around the core in the sheathing zone; and providing, in the sheathing zone, a microelectronic chip element provided with a wire section, in such a way that the sheathing fiber that wraps around the core also wraps around the chip element and the wire section thereof.

According to an alternative embodiment, a series of chip elements provided with their wire section is provided in the sheathing zone, to form a sheathed wire incorporating spaced-apart chip elements.

The present invention also provides a sheathed wire comprising a core having a sheathing fiber wrapped around it. The wire comprises, caught between the core and the sheathing fiber, microelectronic chip elements spaced apart along the sheathed wire, each chip element being provided with at least one wire section also caught between the core and the sheathing fiber.

BRIEF DESCRIPTION OF THE DRAWINGS

Other advantages and features will become more clearly apparent from the following description of particular embodiments of the invention given for non-restrictive example purposes only and represented in the appended drawings, in which:

FIGS. 4A and 4B show, in top view and in end view, chip elements packaged in the form of a chain;

FIG. 5 schematically shows an embodiment of a chain of chip elements easing the automation of the incorporation of the elements in a sheathed wire; and FIG. 6 shows an embodiment of a chip element enabling to notch a support wire.

DESCRIPTION OF A PREFERRED EMBODIMENT OF THE INVENTION

To ease the handling of individualized chip elements of very small size (possibly smaller than 1 mm), it is provided to incorporate them in spaced-apart fashion in a sheathed wire. The chip elements will be caught between the wire core and a sheathing fiber helically wrapped around the core.

To avoid for the chip elements to have the tendency to escape between the consecutive spirals of the sheathing fiber, said elements will be provided with wire sections also caught between the core and the sheathing fiber. The sheathing sections may advantageously be the dipole antennas of chip elements integrating radio frequency transmit-receive functions, or RFID.

The sheathed wire, wrapped on a spool, can be easy manipulated. In addition to the fact that the wire may be used to manufacture fabrics, it may be cut and incorporated in other objects, manually or in automated fashion, by limiting risks of losing the chip elements or of twisting the dipole antennas.

Figure 2:
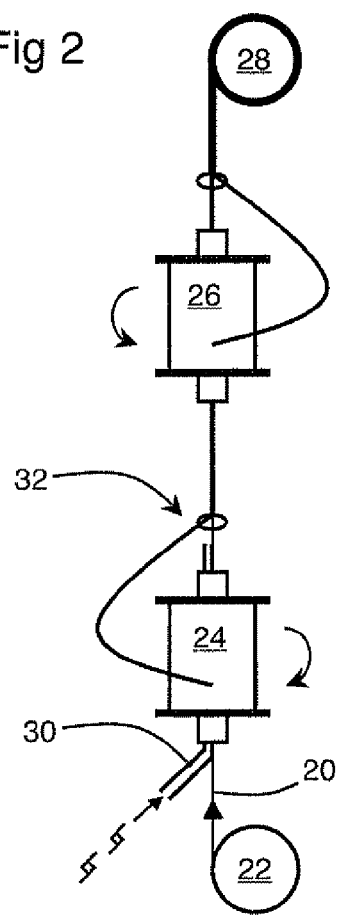
FIG. 2 schematically shows a sheathing installation used to incorporate chip element spaced apart in a continuous wire.

FIG. 2 schematically shows a conventional sheathing installation capable of being used to incorporate chip elements in a sheathed wire by way of simple modifications. Such an installation is for example described in patent U.S. Pat. No. 4,262,480.

A core 20 unwinds from a supply spool 22, axially crosses two successive reels 24 and 26, and ends up being wound on a receiving spool 28. Each of reels 24 and 26 stores a sheathing fiber and is associated with a rotating mechanism rotating around the advancing core and wrapping the sheathing fiber around it. The two winding mechanisms rotate in reverse directions, whereby the outgoing sheathed wire comprises two sheathing fiber layers, formed of helixes of opposite directions. The ratio of the core advancement to speed to the rotation speed of the winding mechanisms defines the helix pitch.

As shown, it is conventional to work vertically from bottom to top, that is, supply spool 22 is at the bottom and receive spool 28 is at the top. The winding mechanisms are, in FIG. 2, provided to wrap the sheathing fiber is around core 20 after passing through the reels (in the core advancing direction).

To incorporate chip elements in the wire being formed, an insertion device 30 is provided, preferably at the level of first reel 24. This insertion device, for example, in the form of a tube having a diameter adapted to chip elements 10, guides them all the way to a sheathing zone 32 where the sheathing fiber of reel 24 is wrapped around core 20. This tube crosses reel 24 from bottom to top and emerges close to zone 32.

individual elements 10 are for example projected by means of compressed air through tube 30 all the way to zone 32, where they are caught by the sheathing fiber being wrapped.

Figure 2B:
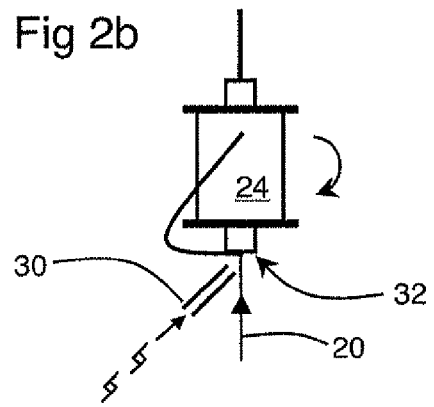
FIG. 2b shows an alternative embodiment of a detail of the installation of FIG. 2.

FIG. 2b shows another possible conventional configuration of reel 24 with its winding mechanism. The wrapping of the sheathing fiber around core 20 occurs at the reel inlet (in the direction of advancement of core 20). Sheathing zone 32 is thus located at the inlet of reel 24. Such a configuration enables to use a shorter insertion device 30, since it must no longer cross reel 24. This eases the supply of the insertion device with chip elements 10.

To enable to supply insertion device 30 by gravity, which would further simplify the method, it may be envisaged to reverse the installation, that is, to have core 20 advance from top to bottom.

Figure 3:
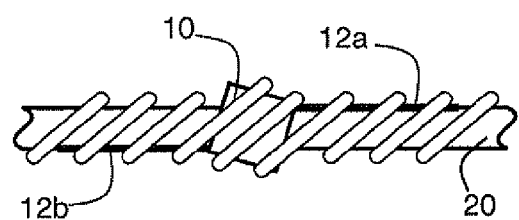
FIG. 3 shows a sheathed wire section formed by means of the installation of FIG. 2.

FIG. 3 shows a sheathed wire section obtained at the outlet of first reel 24, illustrating a chip element 10, with its wire sections 12a and 12b, caught between core 20 and the helically-wrapped sheathing fiber, coming from reel 24. It is desired to have wire sections 12a and 12b substantially parallel to core 20, as shown.

A preferred way of conveying chip elements 10 to sheathing zone 32 is discussed hereinafter.

FIGS. 4A and 4B schematically show a chain 40 of microelectronic chip elements 10 that may be formed, for example, by a method described in patent application EP2099060.

FIG. 4A shows a section of chain 40 in top view. Several chip elements 10 are connected between two parallel support wires 12a and 12b.

FIG. 4B shows one of chip elements 10 in end view. The element is provided with two lateral grooves wherein support wires 12a and 12b are embedded therein. Such grooves may be provided with electric connection pads in the case where the support wires are conductors and are used to transmit electric signals.

Such a chain 40, by selecting wires 12a and 12b of sufficient stiffness, may be pushed along insertion tube 30 while keeping the interval between chip elements 10. Element 10 at the chain end, when it reaches sheathing zone 32, is caught by the sheathing fiber being wrapped and pulled off from the rest of the chain. (Hereafter, "element 10", is used to designate chip element 10, possibly provided with its wire sections 12.)

Chain 40 may be continuously or intermittently supplied at an average speed smaller than the advancing speed of core 20. The resulting sheathed wire will contain regularly spaced-apart chip elements, according to a pitch proportional to the chain pitch and to the ratio of the core speed to the chain supply speed.

To ease the advancing of chain 40 in tube 30, the tube wall may be longitudinally provided with a series of channels inclined in the chain advancing direction, through which compressed air is insufflated.

With the method such as described to this point, the breaking point of wires 12 of the chain at the time when chain-end element 10 is caught is poorly controlled. If insertion tube 30 is aligned in the advancement direction of core 20, as in FIG. 2, the breaking may occur anywhere in the chain section in tube 30.

To promote a breaking of wires 12 between the two elements 10 at the chain end, tube 30 is preferably inclined with respect to the axis of core 20, as shown in FIG. 2b. Thus, the tensile stress exerted on outgoing element 10 causes the jamming of the next element 10 between the edges of the outlet port of tube 30. This element, thus jammed, avoids the transmission of the tensile stress to the rest of chain 40. The jammed element will be released as soon as the tensile stress stops due to the breaking of wires 12.

According to a variation, to control the wire breaking, it is possible to provide at the end of tube 30 a mechanism which blocks element 10 about to come out of the tube, while outgoing element 10 is provided in the sheathing zone. Flexible rollers arranged to pinch the chain and to drive it by friction are provided for this purpose. The rollers are stopped on each passing of an element 10, for the time necessary for the preceding element to be caught in the sheathing zone.

Although it can thus be ensured for the breaking of wires 12 to occur between the two elements 10 at the end of the chain, the location of the breaking between these two elements is not controlled. This is not suitable to form dipole antennas.

FIG. 5 shows an embodiment of chain 40 allowing a controlled breaking of wires 12, especially in order for the wire sections remaining attached to each pulled-off chip element to have selected lengths.

Wire sections 12a and 12b between two elements 10 each have a notch, respectively 50a and 50b. These notches define preferential breaking points, or intentional incipient breaking points, intended to break before any other point of the wires when a sufficient tensile stress is exerted on chain 40. The notches may be made in different ways, for example, by a saw cut, the driving in of a blade, a partial corrosion, or a partial melting.

Notches 50a and 50b have been shown at the center of the wire sections between two chip elements 10. This is convenient in a situation where the wires have no further function, other than taking part in the maintaining of is the individual chip elements between the core and the sheathing fiber of the sheathed wire (FIG. 3).

If groups of several consecutive chip elements interconnected in the sheathed wire are desired to be incorporated, wires 12 will be notched only between the last chip element of a first group and the first element of the next group. The chain supply is then performed with a pitch corresponding to the group length. The pitch synchronization is such that the outgoing group is supplied at the advancing speed of core 20, and the supply stops when the first chip element in the next group reaches the edge of the outlet port of insertion tube 30. Then, the outgoing group is pulled off from the rest of the chain at the notch level in the wire sections in front of the element at the port edge.

Figure 1:
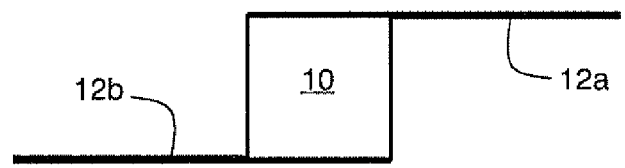
FIG. 1, previously described, schematically shows a chip element provided with a dipolar antenna.

If the wires are to be used as a dipole antenna for an RFID element, notches 52a and 52b are rather provided on the opposite sides of wire sections 12a and 12b. Thus, when a tensile stress is exerted on the chain, elements 10 detach with antenna sections pointing in opposite directions, as shown in FIG. 1. This implies that the pitch between elements 10 in the chain corresponds to the antenna length.

FIG. 6 shows in side view an embodiment of a chip element 10 enabling to notch wire 12 on forming of the chain. Element 10 comprises a groove wherein the wire 12 (12a or 12b) is inserted therein. One of the lateral walls of the groove comprises, at an end of the groove, a sharp rib 60 extending across part of the groove width. This rib notches wire 12 at the time when said wire is connected to the chip element. By providing the two grooves of each chip element with such a rib, notches 52a and 52b of FIG. 5 may be formed with no additional step.

The invention claimed is:
1. A method for forming a sheathed wire, comprising the following steps of:
axially advancing a core through a sheathing zone;
providing, in the sheathing zone, a series of microelectronic chip elements and at least one wire section connected to each chip element from an insertion device; and,
wrapping a sheathing fiber around the core in the sheathing zone, around the microelectronic chip elements, and around the wire sections concurrently with the step of providing the microelectronic chip elements and the wire sections in the sheathing zone from the insertion device to form the sheathed wire such that the microelectronic chip elements are spaced-apart from each other.

2. The method according to claim 1, wherein the series of microelectronic chip elements is provided in the form of a chain comprising the microelectronic chip elements attached to the wire sections, each of the wire sections including a notch forming a preferential breaking point when the wire section is submitted to tensile stress.

3. The method according to claim 2, wherein the chain is provided in the sheathing zone by a guide unit.

4. The method according to claim 2, wherein the chain is provided in the sheathing zone by a tube inclined with respect to a longitudinal axis of the core.

5. The method according to claim 2, further comprising driving the chain towards the sheathing zone by friction between rollers, the rollers configured to be temporarily stopped on each passing of one of the microelectronic chip elements.

6. The method according to claim 2, wherein the chain is provided in the sheathing zone at a speed lower than an advancing speed of the core.

7. A sheathed wire comprising:

a core;

a sheathing fiber wrapped around the core;

microelectronic chip elements disposed between the core and the sheathing fiber, and spaced apart along the sheathed wire; and at least one wire section connected to each microelectronic chip and disposed between the core and the sheathing fiber, the at least one wire section including a notch forming a preferential breaking point when the wire section is submitted to tensile stress.

8. The sheathed wire according to claim 7, wherein the at least one wire section includes two conductive wire sections, the two conductive wire sections each being substantially parallel to the core and configured to form a dipole antenna when connected to radio frequency transceiver circuits integrated into the microelectronic chip element.

9. The sheathed wire according to claim 7, wherein the notch defines an end of the at least one wire section.

* * * * *